US 8,212,566 B2

(12) United States Patent
Mullen

(10) Patent No.: US 8,212,566 B2
(45) Date of Patent: Jul. 3, 2012

(54) ANGULAR POSITION SENSING BASED ON MAGNETICALLY INDUCED BEAM DEFORMATION

(75) Inventor: Charles Glen Mullen, Fort Collins, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 528 days.

(21) Appl. No.: 12/509,320

(22) Filed: Jul. 24, 2009

(65) Prior Publication Data

US 2011/0018536 A1 Jan. 27, 2011

(51) Int. Cl.
*G01V 3/00* (2006.01)

(52) U.S. Cl. ............ 324/321; 324/318; 324/207.13

(58) Field of Classification Search .......... 324/321, 324/319, 318, 207.13
See application file for complete search history.

(56) References Cited

U.S. PATENT DOCUMENTS

| | | | | |
|---|---|---|---|---|
| 5,760,586 | A * | 6/1998 | Foerster et al. | 324/321 |
| 5,955,879 | A | 9/1999 | Durdle et al. | |
| 6,694,828 | B1 * | 2/2004 | Nicot | 73/862.326 |
| 7,400,139 | B2 * | 7/2008 | Spellman et al. | 324/207.25 |
| 7,956,602 | B2 * | 6/2011 | Kasajima et al. | 324/207.13 |
| 2002/0041074 | A1 | 4/2002 | Benz et al. | |
| 2002/0089324 | A1 | 7/2002 | Miyata et al. | |
| 2007/0040355 | A1 | 2/2007 | Spratte et al. | |
| 2007/0063700 | A1 | 3/2007 | Levitt et al. | |

FOREIGN PATENT DOCUMENTS

WO 2009041023 A1 4/2009

OTHER PUBLICATIONS

International Search Report and Written Opinion From Corresponding PCT Application No. PCT/US2010/043139, Apr. 21, 2011 (9 pgs).

* cited by examiner

*Primary Examiner* — Louis Arana

(57) ABSTRACT

A sensor for sensing an angular position of an instrument relative to a static magnetic field includes a flexible beam, an electromagnetic device, and a measuring device. The beam at one end may be coupled to the instrument, and lies along a sensor axis when the beam is in a non -flexed state. The electromagnetic device is coupled to the beam and is configured for generating a magnetic sensor field aligned with the sensor axis. The measuring device communicates with the beam and is configured for measuring a property of the beam related to an amount of flexure of the beam. The sensor may be utilized to set the instrument at a desired angle prior to operating the instrument, and to determine whether the instrument has deviated from the desired angle during operation. The instrument may include a probe spinning module such as may be utilized in magnetic resonance experiments.

20 Claims, 3 Drawing Sheets

ANGULAR POSITION SENSING BASED ON MAGNETICALLY INDUCED BEAM DEFORMATION

FIELD OF THE INVENTION

The present invention relates generally to the sensing of the position of an instrument. More specifically, the invention relates to the sensing of the angular position of an instrument relative to a reference direction such as the orientation of a magnetic field.

BACKGROUND OF THE INVENTION

In the operation of various types of instruments, it is often desired that the instrument be set or maintained at a specific position relative to some reference datum (e.g., an axis, surface, plane, point, etc.). The success or optimization of the instrument's operation may depend on the ability to set the instrument to a precise position and/or maintain that position during operation. The nature of the instrument may be such that although the instrument has been correctly set at the required position, the instrument may deviate from that set position due to some influence such temperature variation, vibration, external impact, removal and reinstallation of a component, etc.

One example of a position-dependent instrument is a sample holder (or rotor) and its associated probe spinning module and probe RF circuit as utilized in nuclear magnetic resonance (NMR) spectrometry. As appreciated by persons skilled in the art, a typical NMR spectrometer typically includes radiofrequency (RF) transmitting/receiving electronics, a NMR sample probe, and a source of a strong, static magnetic field ($B_0$ field) in which the sample probe is immersed such as a superconducting magnet. The NMR sample probe includes the probe spinning module, the sample holder (which contains a liquid or solid sample), and one or more RF coils that serve as the electromagnetic coupling between the RF electronics and the sample. The RF electronics are operated to irradiate the sample with RF energy ($B_1$ field) and receive RF signals emitted from the sample in response to the RF input. The response signals are utilized to extract information regarding the sample. To greatly improve the resolution of spectral data for solid-phase samples and certain types of inhomogeneous liquid-phase samples, the sample holder can be supported in and rotated by the probe spinning module, with the sample holder functioning as a rotor and the probe spinning module functioning as the corresponding stator configured to spin the sample holder at a high rate (e.g., $10^6$ RPM). In magic-angle spinning (MAS) techniques, the sample holder or rotor is positioned to spin at exactly the "magic angle" of 54.7° relative to the direction of the externally applied static magnetic $B_0$ field to further enhance resolution.

NMR instrumentation in general requires a high level of precision and stability, and this is particularly the case in spinning techniques where the sample holder must be set and maintained at the magic angle throughout the experiment. To set the sample holder to the magic angle, the probe spinning module may be connected to an adjustment mechanism that enables the user to move or pivot the probe spinning module to the proper position. An adequate technique for precisely and easily setting the angular position of the probe spinning module and verifying that the as-set position is correct does not presently exist. Consequently, users of NMR spectrometers often run their experiments without realizing that the sample holder is not operating at the desired angle and thus without realizing that their acquired data has been compromised by the off-angle operation. Moreover, even assuming that the probe spinning module (and thus the sample holder) has been set up at the correct angle, various influences arising during an experiment may cause the sample holder to deviate from this angle. In particular, changing the temperature of the sample may change the dimensions of components or structures of the instrumentation that are inherently temperature sensitive (i.e., have coefficients of thermal expansion). Depending on where these components are located or how they function, an alteration in dimension might affect the angular position of the probe. Hence, when such components or structures are subjected to heat transfer, the probe spinning module may go off-angle. An acceptable solution for addressing this problem does not presently exist. To verify the proper positioning of the probe spinning module during an experiment, a user would need to pause the experiment, remove the probe spinning module containing the experimental sample, install a sample holder containing a reference sample designed to check the angle, operate the probe spinning module with the reference sample and make any necessary adjustments to the position of the probe spinning module, remove the angle-sensing sample holder and reinstall the experimental sample holder, and resume the experiment. For an experiment that requires sample irradiation at different predetermined temperatures, these steps would need to be undertaken several times throughout the course of the experiment. Moreover, the physical switching between probes in and of itself may adverse affect the proper setting of the angle of the probe.

Accordingly, there is an acknowledged need for improvements in the sensing of the position of instruments in general, and in particular for instruments associated with the spinning of NMR sample holders.

SUMMARY OF THE INVENTION

To address the foregoing problems, in whole or in part, and/or other problems that may have been observed by persons skilled in the art, the present disclosure provides apparatus, devices, systems and/or methods relating to proportional valves, as described by way of example in implementations set forth below.

According to one implementation, a sensor is provided for sensing an angular position of an instrument relative to a static magnetic field. The sensor includes a flexible beam, an electromagnetic device, and a measuring device. The beam includes a proximal end, a distal end, and a length extending from the proximal end to the distal end. The proximal end is configured for coupling to the instrument, and the length lies along a sensor axis when the beam is in a non-flexed state. The electromagnetic device is coupled to the beam and is configured for generating a magnetic sensor field aligned with the sensor axis. The measuring device communicates with the beam and is configured for measuring a property of the beam related to an amount of flexure of the beam.

According to another implementation, a probe spinning instrument includes a probe spinning module and a sensor for sensing an angular position of the probe spinning module relative to a static magnetic field. The sensor includes a flexible beam, an electromagnetic device, and a measuring device. The beam includes a proximal end, a distal end, and a length extending from the proximal end to the distal end. The proximal end is configured for coupling to the probe spinning module, and the length lies along a sensor axis when the beam is in a non-flexed state. The electromagnetic device is coupled to the beam and is configured for generating a magnetic sensor field aligned with the sensor axis. The measuring device communicates with the beam and is configured for measuring a property of the beam related to an amount of flexure of the beam.

According to another implementation, a method is provided for sensing an angular position of an instrument relative to a static magnetic field in which the instrument is immersed. The method includes generating a magnetic sensor field aligned with a sensor axis of a sensor, the sensor comprising a flexible beam attached to the instrument. An amount by which the beam is flexed from a non-flexed state is measured. If the sensor field when initially generated is aligned with the static magnetic field, the beam is in a non-flexed state in which the beam lies along the sensor axis. If the sensor field when initially generated is unaligned with the static magnetic field, the sensor field is forced to become aligned with the static magnetic field such that the beam is flexed. The measurement may be correlated to the angular position of the instrument.

BRIEF DESCRIPTION OF THE DRAWINGS

The invention can be better understood by referring to the following figures. The components in the figures are not necessarily to scale, emphasis instead being placed upon illustrating the principles of the invention. In the figures, like reference numerals designate corresponding parts throughout the different views.

DETAILED DESCRIPTION OF THE INVENTION

The subject matter disclosed herein generally relates to systems, apparatus, devices, instruments, processes and methods related to position sensors such as for example may be utilized for spinning a material such as an NMR sample. Examples of implementations relating to the invention are described in more detail below with reference to FIGS. 1-5. These examples are provided in the context of NMR spectrometry, but it will be recognized that the broad aspects of the invention may be applicable to other types of technologies entailing the use of sensors for determining the position of an instrument.

Figure 1:
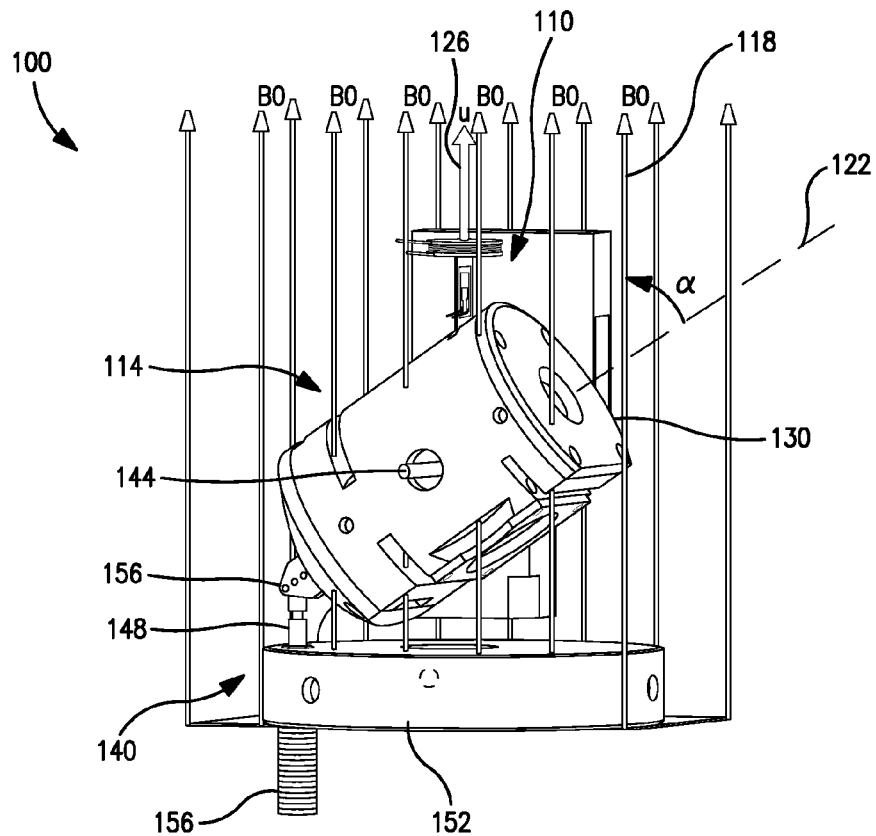
FIG. 1 is an elevation view of an instrument assembly as an example of an operating environment for a sensor provided in accordance with the present teachings.
Figure 2:
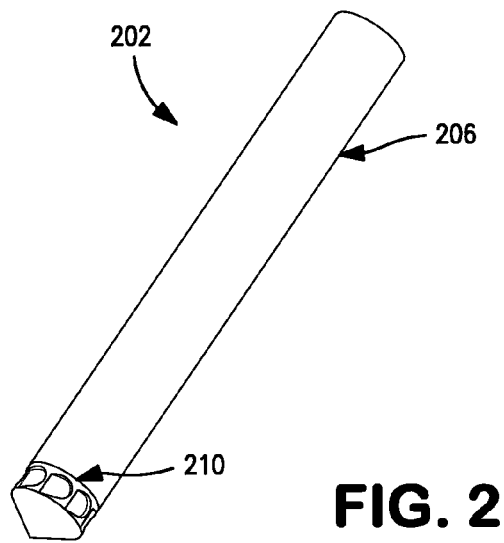
FIG. 2 is a perspective view of an example of a sample holder that may be utilized in the instrument assembly illustrated in FIG. 1.

FIG. 1 is an elevation view of an instrument assembly 100 as an example of an operating environment for a sensor 110 provided in accordance with the present teachings. Generally, the sensor 110 may be mounted to any object or instrument 114 whose position relative to some reference axis (or plane, point, etc.) 118 needs to be determined, maintained and/or adjusted before, during and/or after use or operation of the object or instrument 114. The reference axis 118 may be associated with the instrument assembly 100, with another instrument, or with some other structure. In the illustrated implementation, the reference axis 118 is a vector describing the resultant direction and magnitude of an applied static magnetic field ($B_0$ field) in which the instrument 114 and sensor 110 are immersed. The position of the instrument 114 may be described, for example, by an axis 122 associated with the instrument 114. Thus, the position to be sensed may be described as the angle a made between the instrument axis 122 and the reference axis 118. In operation, the sensor 110 may be activated to generate a magnetic field $\mu$, which will be referred to as the sensor field 126. As described in more detail below, the position of the instrument 114 relative to the static $B_0$ field 118 affects the interaction between the $B_0$ field 118 and the sensor field 126. The response of the sensor 110 to this interaction may be utilized to quantify the position of the instrument 114.

In the specific example illustrated in FIG. 1, the instrument assembly 100 is an NMR spectrometer, of which only a portion is shown. The instrument 114 is a probe spinning module of the type utilized in solid-state NMR spectrometry, and particularly the type of NMR experimentation entailing magic angle spinning (MAS). As a general matter, NMR spectrometry and the associated instrumentation utilized and experiments performed are understood by persons skilled in the art. Accordingly, the NMR-related example being provided need not be described in detail other than as relates to the subject matter presently being disclosed.

The probe spinning module 114 includes a bore 130 into which an NMR sample holder 202 is inserted. As an example, the sample holder 202 may be of the type illustrated in FIG. 2, which generally includes a main body 206 containing an NMR sample to be irradiated by an RF coil of the NMR probe and a turbine structure 210. The probe spinning module 114 may be configured to apply one or more gas jets to the turbine structure 210, whereby the sample holder 202 spins within the bore 130 at a specified angular speed while being supported by suitable structural or gas bearings. The bore 130 and thus the sample holder 202 lie along the instrument axis 122. For solid-state NMR, the optimal angular position of the sample holder 202 relative to the $B_0$ field 118 is 54.7°, known as the "magic angle." Thus, in some implementations, the sensor 110 may be utilized to determine whether the angle a between the instrument axis 122 and the B0 field 118 is at the desired value of 54.7°.

The probe spinning module 114 may further include an angle adjustment mechanism 140 configured to adjust the angle of the probe spinning module 114 in a manual or automated fashion. In the present example, the probe spinning module 114 is pivotable about an axis 144 (i.e., a structural member such as an axle or the like). The angle adjustment mechanism 140 includes a linkage 148 extending through a structural portion 152 of the instrument assembly 100 and attached to a coupling 156 located at an end of the probe spinning module 114. Actuation of the linkage 148 upward or downward, such as by rotation of a threaded member 156 in a corresponding direction, pivots the probe spinning module 114 in one direction or the other so as to decrease or increase the angle $\alpha$.

Figure 3:
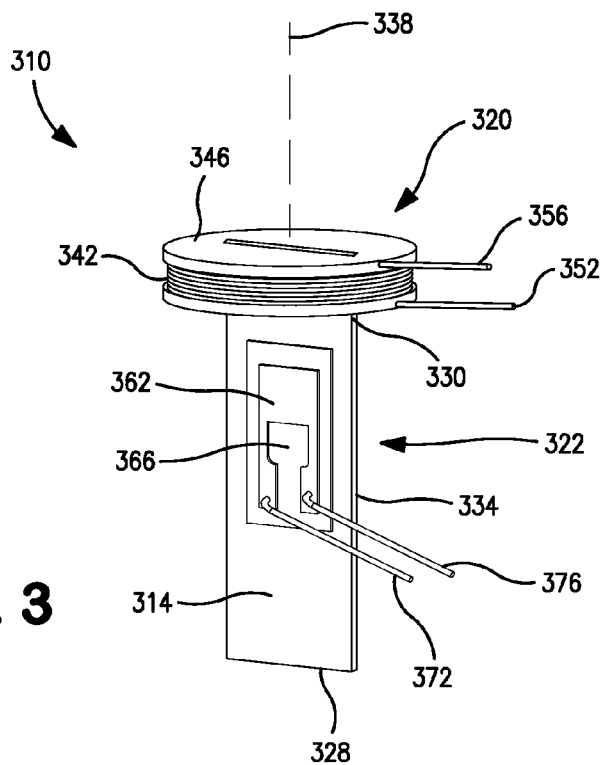
FIG. 3 is a perspective view of an example of a sensor in accordance with one implementation of the present teachings.

FIG. 3 is a perspective view of an example of a sensor 310 in accordance with one implementation of the present teachings. The sensor 310 generally includes a flexible or deformable beam (or rod, bar, plate, sheet, etc.) 314, a means or device 320 coupled to the beam 314 for generating the above-noted magnetic sensor field 126 (FIG. 1), and a means or device 322 operatively communicating with the beam 314 for measuring a property of the beam 314 related to an amount or degree of flexure of the beam 314.

The beam 314 generally includes a proximal end 328, a distal end 330, and a length 334 extending from the proximal end 328 to the distal end 330. The distal end 330 may be attached to the probe spinning module or other type of instrument 114 (FIG. 1) in a fixed manner by any suitable means. Hence, when the beam 314 is flexed it remains anchored to the probe spinning module 114 as a cantilever. The coupling relation between the beam 314 and the probe spinning module 114 may be configured such that the sensor 310 is detachable for service, replacement, etc. When the beam 314 is in the non-flexed state shown in FIG. 3, the entire length 334 of the beam 314 lies along a sensor axis 338. In the present example, the length 334 is the predominant dimension of the beam 314 such that the beam 314 may be said to be oriented along the sensor axis 338 and the sensor axis 338 generally corresponds to the longitudinal axis of the beam 314. The material from which the beam 314 is constructed, and the length 334 and thickness of the beam 314, may be selected such that the beam 314 is bendable or deformable in proportion to the force imparted due to the interaction of the magnetic sensor field 126 and the applied $B_0$ field 118. Moreover, the beam 314 should have sufficient elasticity such that the beam 314 can be cycled between flexed and non-flexed states in a repeatable manner.

The sensor field-generating device 320 may be any device suitable for generating the sensor field 126 along the sensor axis 338 when the sensor field-generating device 320 is mounted to the beam 314 in a correct orientation. For example, the sensor field-generating device 320 may be an electromagnetic device such as a solenoid or current loop. In the example specifically illustrated in FIG. 3, the sensor field-generating device 320 includes a length of electrical conductor (e.g., wire) 342 wound or coiled around a spool 346. The spool 346 may be coupled to the beam 314 at the distal end 330 by any suitable means such as by fixing the beam 314 in a slot or hole of the spool 346. Leads 352 and 356 of the conductor 342 may be placed in signal communication with any suitable AC or DC power source (not shown). When the sensor field-generating device 320 is activated, current flowing through the wound portion of the conductor 342 generates the sensor field 126 along the sensor axis 338 in the direction shown in FIG. 1.

The measuring device 322 may be any device suitable for measuring a property of the beam 314 related to an amount or degree of flexure of the beam 314. In the present example, the measuring device 322 is a strain gauge mounted to a planar surface of the beam 314. The strain gauge may include a resistive network 362 formed on a substrate 366 and electrical leads 372 and 376 for interconnecting the resistive network 362 to any suitable measurement signal-conditioning circuitry (e.g., an amplifier and bridge circuit, not shown). The operation and design of a typical strain gauge are understood by persons skilled in the art and thus need not be described in detail herein. Generally, flexing or bending of the beam 314 causes strain in the beam 314. The amount of strain is proportional to the degree to which the beam 314 has been bent. A simplified expression for the value of strain ε is as follows: $\epsilon = \sin(\theta) t/L$, where θ is the angle through which the beam 314 has been bent, t is the thickness of the beam 314, and L is the length 334 of the beam. The resistance of the resistive network 362 varies in proportion to the magnitude of strain. Measurement signals on the leads 372 and 376 may thus be utilized to correlate the amount of strain to the amount of beam flexure. It will be noted that while one strain gauge is utilized in the present example, more than one strain gauge may be mounted to the beam 314 and their respective functions coordinated appropriately.

Referring back to FIG. 1, sensor 110 is particularly useful in implementations where it is desired that the probe spinning module 114 (or any other instrument) be maintained at a specific position during its operation, such as the magic angle. The sensor 110 may be oriented relative to the probe spinning module 114 such that when the probe spinning module 114 is positioned at the desired angle α relative to the $B_0$ field 118 (or other reference axis), the sensing field 126 generated by the sensor 110 is aligned with the $B_0$ field 118, i.e., the angle between the sensing field 126 and the $B_0$ field 118 is zero. For example, the beam of the sensor 110 may be mounted to the probe spinning module 114 such that the beam and as-generated sensor field 126 are parallel with the $B_0$ field 118. In the example illustrated in FIG. 1, if the desired angle α between the instrument axis 122 and the $B_0$ field 118 is the magic angle of 54.7° and the outer surface of the probe spinning module 114 is parallel with the instrument axis 122, the beam of the sensor 110 may be mounted to the probe spinning module 114 such that the angle between the beam and the outer surface is 35.3°. As an example of operation, assume that the probe spinning module 114 has been properly positioned at the desired angle of 54.7° and the sensor 110 is then activated to generate the sensor field 126. In this case, the as-generated sensor field 126 is aligned with the $B_0$ field 118 such that no force is generated on the beam of the sensor 110. The electrical response from the sensor 110 will indicate that the probe spinning module 114 is at the desired angular position such that no adjustment is required.

Figure 4:
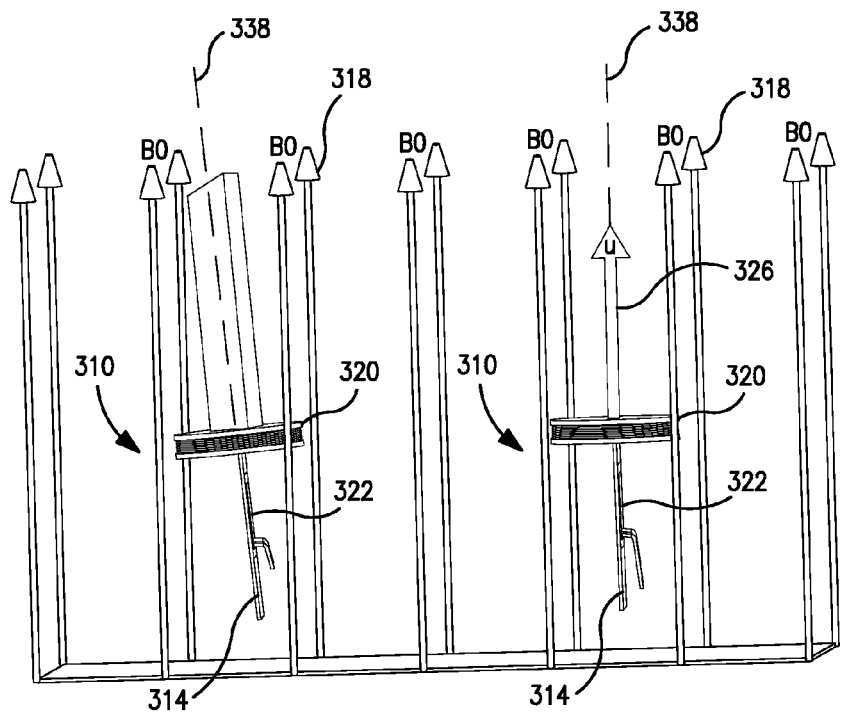
FIG. 4 illustrates an example of operation of the sensor illustrated in FIG. 3.

FIG. 4 illustrates the operation of the sensor 310 of the type illustrated in FIG. 3, in a case where the instrument is positioned off-angle such that adjustment will be required. Specifically, the left portion of FIG. 4 illustrates a non-energized sensor 310, and the right portion of FIG. 4 illustrates the same sensor 310 now energized with consequent beam flexure. The instrument to which the sensor 310 is anchored is not shown in FIG. 4 for simplicity. Referring to the left portion of FIG. 4, the position of the instrument is not at the desired angle relative to a $B_0$ field 318. As the sensor 310 has not yet been energized, the beam 314 of the sensor 310 is in a non-flexed state and lies entirely along the sensor axis 338. The sensor 310 is coupled to the instrument such that an angle exists between the sensor axis 338 and the direction of the $B_0$ field 318, which is indicative of the fact that the instrument is not aligned with the $B_0$ field 318 at the desired angle. Depending on the design and operating principle of the sensor 310, the angle between the sensor axis 338 and the Bo field 318 may be proportional to or correspond exactly to the angle through which the instrument deviates from the desired angle.

Referring to the right portion of FIG. 4, the sensor 310 has been energized to generate a magnetic sensor field 326 directed along the sensor axis 338. Because the sensor field 326 and the $B_0$ field 338 are not initially aligned, a magnetic moment exists and a force is imparted to the beam 314. The force bends and strains the beam 314 to align the sensor field 326 with the $B_0$ field 318, as can be seen in the right portion of FIG. 4. The strain gauge 322 mounted to the beam 314 measures the amount of strain in the beam 314, which is dependent on the angular difference between the sensor axis 338 (and the sensor field 326 when initially applied) and the $B_0$ field 318. The position of the instrument may be adjusted until the strain gauge 322 is zeroed out, i.e., until the strain gauge 322 indicates that the beam 314 has returned to a non-flexed state, which in turn indicates that the magnetic moment is aligned with the $B_0$ field 318 at the desired angle. One way of expressing the moment $M_0$ required to deflect and align the beam 314 to the $B_0$ field 318 is as follows: $M_0 = \sin(\theta) 2EI/L$, where θ is the angle through which the beam 314 has been bent or deflected, E is the modulus of elasticity of the beam 314, I is the moment of inertia of the beam 314, and L is the length of the beam 314.

Figure 5:
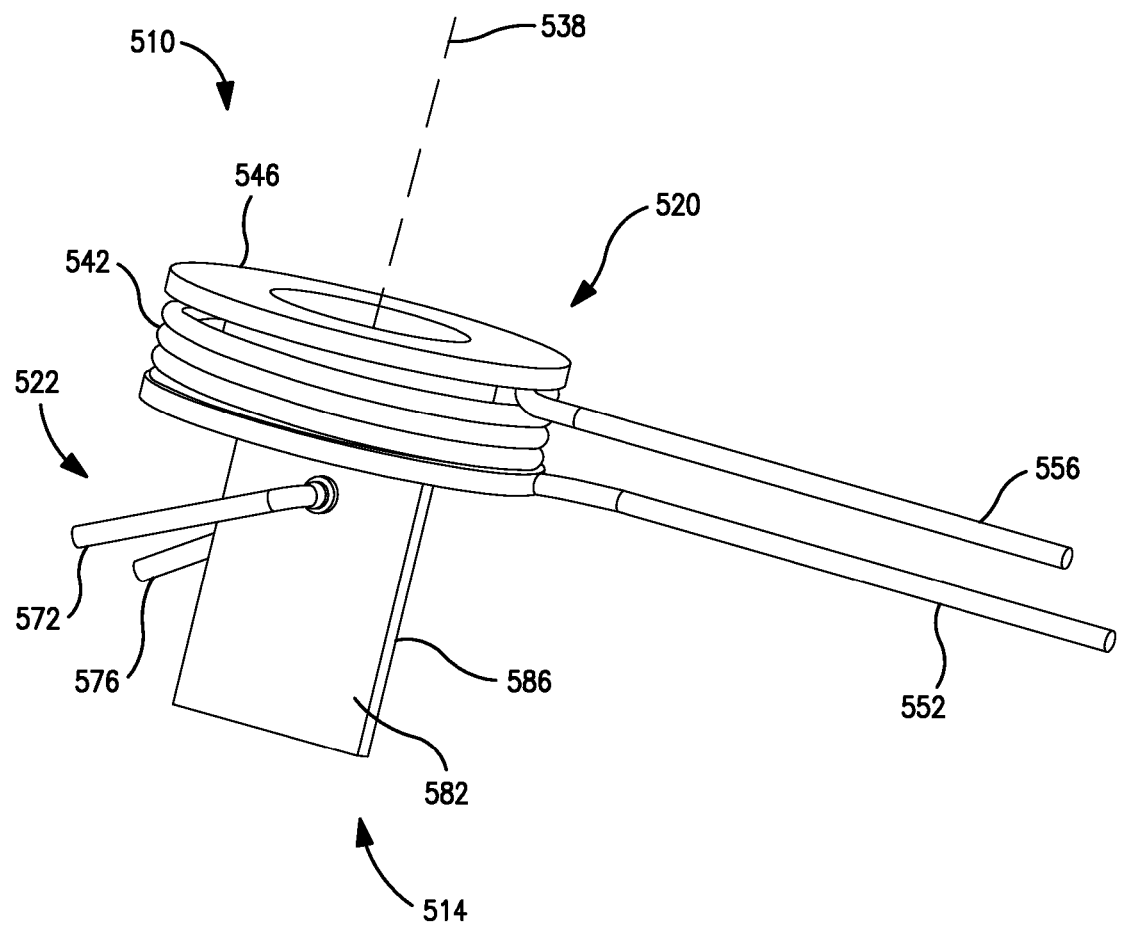
FIG. 5 is a perspective view of an example of a sensor in accordance with another implementation of the present teachings.

FIG. 5 is a perspective view of an example of a sensor 510 in accordance with another implementation of the present teachings. The sensor 510 generally includes a flexible or deformable beam 514, a means or device 520 coupled to the beam 514 for generating the above-noted magnetic sensor field along a sensor axis 538, and a means or device 522 operatively communicating with the beam 514 for measuring a property of the beam 514 related to an amount or degree of flexure of the beam 514. In this implementation, the beam 514 is constructed from a piezoelectric material. Generally, the piezoelectric material may be any material capable of generating an electric potential in response to applied mechanical stress. Non-limiting examples include various crystals and ceramics (e.g., quartz, lead zirconate titanate or PZT, etc.) and some polymers (e.g., polyvinylidene fluoride or PVDF). The sensor field-generating device 520 may be an electromagnetic device such as described above. Thus, for example, the sensor field-generating device 520 may include a conductor 542 wound on a spool 546 about the sensor axis 538 with leads 552 and 556 extending from the wound portion for connection to a suitable power source. The measuring device 522 includes two electrical leads 572 and 576 appropriately connected to the beam 514 on opposing sides of the thickness of the beam 514, whereby the voltage impressed on the leads 572 and 576 in response to bending of the beam 514 may be correlated to the amount or degree to which the beam 514 has been bent. As the bending of the beam 514 causes a charge asymmetry that generates a voltage across the beam 514 via the piezoelectric effect, the beam 514 itself may be considered as comprising a part of the measuring device 522 in this implementation. In the illustrated example, the beam 514 includes two adjacent beam units 582 and 586, each connected to a respective lead 572 and 576. When the sensor field generated by the sensor field-generating device 520 is not aligned with the $B_0$ field, the resulting force applied to the beam units 582 and 586 will cause one of the beam units 582 or 586 to be in compression and the other beam unit 586 or 582 to be in tension, thereby creating a net electrical charge in the piezoelectric material and attendant output voltage at the leads 572 and 576. The sensor 510 illustrated in FIG. 5 otherwise operates in a manner similar to the sensor 310 illustrated in FIGS. 3 and 4.

An example of operating the sensor 110 (such as the sensor 310 or 510) will now be described in the context of an NMR experiment, with reference being made to FIG. 1. The angle of the probe spinning module 114 is first set to the desired magic angle of 54.7°, such as by utilizing the angle adjustment mechanism 140 described above. During this initial setup, the sensor 110 may be utilized to verify that the magic angle has been obtained. The sample holder 202 (FIG. 2) containing the experimental sample is then loaded into the probe spinning module 114, and the NMR spectrometer is operated to begin the experiment. At one or more times during the experiment, the experiment may be paused and the sensor 110 operated to verify that the sample holder 202 is still positioned at the magic angle, i.e., to determine whether the probe spinning module 114 has deviated from the magic angle. This deviation may occur for a variety of reasons, such as a change in the temperature of the sample, which is deliberate in the case of a variable-temperature (VT) NMR experiment. If it is determined that the sample holder 202 is no longer positioned at the magic angle, the position of the probe spinning module 114 is adjusted until the magic angle is reestablished. The experiment is then resumed.

In the foregoing process, the steps of operating the sensor 110 and the angle adjustment mechanism 140 may be carried out manually and independently of each other. That is, a user of the NMR spectrometer may participate in pausing the experiment, operating the sensor 110 and the angle adjustment mechanism 140, and resuming the experiment. In other implementations, however, these steps may be fully or partially automated. For example, the control circuitry (not shown) of the NMR spectrometer may execute these steps according to a program designed for the given NMR experiment. The respective functions of the sensor 110 and the angle adjustment mechanism 140 may be coordinated. For instance, the angle adjustment mechanism 140 may be controlled based on feedback provided by the sensor 110 regarding the angular position of the probe spinning module 114 at any given instance of time. The angle adjustment mechanism 140 may include a motor and a counter (not shown) that drives the adjustment of the probe spinning module 114 until a measurement signal outputted from the sensor 110 goes to zero (i.e., the beam of the sensor 110 is no longer flexed).

Without the use of the sensor 110, the user would need to bring the sample back to room temperature, replace the experimental sample with an angle-sensing sample, cool the sample, check the angle, reinstall the experimental sample, and resume the experiment. Switching between the experimental sample and the angle-sensing sample requires physically moving the NMR probe out of the $B_0$ magnetic field. The NMR probe may not be placed back into its previous position within the $B_0$ magnetic field, which compromises the angle setting. Moreover, this angle adjustment process without the sensor 110 would need to be done for all experimental temperatures being tested. This is because various components of the probe spinning module 114 affect its angular position and do so differently at different temperatures due to their coefficients of thermal expansion.

It can thus be seen that the sensor 110 enables the measurement and adjustment of the probe spinning module 114 without requiring a sample change or otherwise unduly interfering with the NMR experiment. The sensor 110 provides measurements by making direct use of an existing operating parameter or condition of the probe spinning module 114, i.e., the static $B_0$ field. The sensor 110 may be implemented in any type of technique employing an NMR probe adapted for sample spinning. Examples include, but are not limited to, techniques relating to magic-angle spinning (MAS), double-orientation rotation (DOR), switched-angle spinning (SAS), variable-temperature (VT) applications, cryogenic applications, etc., and their variations. It can also be seen, however, that applications of the sensor 110 are not limited to probe spinning modules 114 utilized in NMR experiments. Instead, various types of instruments for which position relative to a reference datum is important may benefit from the use of the sensor 110. Moreover, the specific implementations of the sensor 110 described above, which operate based on the interaction of two magnetic fields, may be applied to instruments not normally associated with or requiring the use of a static magnetic field. For instance, the sensor 110 may be mounted appropriately to an instrument, with the sensor 110 configured to generate the sensor field as described above. When it is desired to measure the angular position of the instrument, not only is the sensor 110 energized to generate the sensor field, but also a static magnetic field is generated in an appropriate orientation relative to the sensor 110 and the instrument.

In general, the term "communicate" (for example, a first component "communicates with" or "is in communication with" a second component) is used herein to indicate a structural, functional, mechanical, electrical, optical, magnetic, ionic or fluidic relationship between two or more components or elements. As such, the fact that one component is said to communicate with a second component is not intended to exclude the possibility that additional components may be present between, and/or operatively associated or engaged with, the first and second components.

It will be further understood that various aspects or details of the invention may be changed without departing from the scope of the invention. Furthermore, the foregoing description is for the purpose of illustration only, and not for the purpose of limitation—the invention being defined by the claims.

What is claimed is:

1. A sensor for sensing an angular position of an instrument relative to a static magnetic field, the sensor comprising:
   a flexible beam including a proximal end, a distal end, and a length extending from the proximal end to the distal end, wherein the proximal end is configured for coupling to the instrument, and the length lies along a sensor axis when the beam is in a non-flexed state;
   an electromagnetic device coupled to the beam and configured for generating a magnetic sensor field aligned with the sensor axis; and
   a measuring device communicating with the beam and configured for measuring a property of the beam related to an amount of flexure of the beam.

2. The sensor of claim 1, wherein the electromagnetic device comprises an electrical conductor wound around the sensor axis.

3. The sensor of claim 1, wherein the measuring device comprises a strain gauge mounted to the beam.

4. The sensor of claim 1, wherein the beam includes a piezoelectric material and the measuring device includes two electrical leads respectively connected to opposing sides of the thickness of the beam.

5. A probe spinning instrument comprising:
   a probe spinning module; and
   a sensor for sensing an angular position of the probe spinning module relative to a static magnetic field, the sensor comprising:
      a flexible beam including a proximal end coupled to the probe spinning module, a distal end, and a length extending from the proximal end to the distal end, the length lying along a sensor axis when the beam is in a non-flexed state;
      an electromagnetic device coupled to the beam and configured for generating a magnetic sensor field aligned with the sensor axis; and
      a measuring device communicating with the beam and configured for measuring a property of the beam related to an amount of flexure of the beam.

6. The probe spinning instrument of claim 5, wherein the electromagnetic device comprises an electrical conductor wound around the sensor axis.

7. The probe spinning instrument of claim 5, wherein the measuring device comprises a strain gauge mounted to the beam.

8. The probe spinning instrument of claim 5, wherein the beam includes a piezoelectric material and the measuring device includes two electrical leads respectively connected to opposing sides of the thickness of the beam.

9. The probe spinning instrument of claim 5, further comprising a mechanism for adjusting the angular position of the probe spinning module.

10. The probe spinning instrument of claim 5, further comprising circuitry for processing measurement signals received from the measuring device.

11. The probe spinning instrument of claim 5, further comprising a device for immersing the probe spinning module and the sensor in the static magnetic field.

12. A method for sensing an angular position of an instrument relative to a static magnetic field in which the instrument is immersed, the method comprising:
   generating a magnetic sensor field aligned with a sensor axis of a sensor, the sensor comprising a flexible beam attached to the instrument; and
   measuring a degree to which the beam is flexed from a non-flexed state, wherein:
      if the sensor field when initially generated is aligned with the static magnetic field, the beam is in a non-flexed state in which the beam lies along the sensor axis; and
      if the sensor field when initially generated is unaligned with the static magnetic field, the sensor field is forced to become aligned with the static magnetic field such that the beam is flexed; and
   correlating the measurement to the angular position of the instrument.

13. The method of claim 12, wherein generating the sensor field comprises energizing an electromagnetic device attached to the beam.

14. The method of claim 12, wherein measuring the degree to which the beam is flexed includes measuring strain induced in the beam in response to flexure of the beam.

15. The method of claim 12, wherein measuring the degree to which the beam is flexed includes receiving a signal from a strain gauge mounted to the beam.

16. The method of claim 12, wherein measuring the degree to which the beam is flexed includes measuring stress induced in the beam in response to flexure of the beam.

17. The method of claim 12, wherein the beam includes a piezoelectric material, and measuring the degree to which the beam is flexed includes receiving a signal from a pair of electrical leads connected to the beam.

18. The method of claim 12, further comprising adjusting the angular position of the instrument until measuring indicates that the beam is in a non-flexed state.

19. The method of claim 12, wherein the instrument is a probe spinning module, and further comprising initiating a magnetic resonance experiment by operating the probe spinning module to spin a sample probe loaded therein and generating the static magnetic field.

20. The method of claim 19 further comprising, prior to operating the probe spinning module to spin a sample probe, setting the angular position of the probe spinning module to a desired angle relative to the static field, and adjusting the angular position of the probe spinning module if measuring indicates that the beam is in a non-flexed state.

* * * * *